United States Patent [19]

Miyamato et al.

[11] Patent Number: 5,053,997
[45] Date of Patent: Oct. 1, 1991

[54] DYNAMIC RANDOM ACCESS MEMORY WITH FET EQUALIZATION OF BIT LINES

[75] Inventors: Hiroshi Miyamato; Michihiro Yamada, both of Hyogo, Japan

[73] Assignee: Mitsubishi Denki Kabushiki Kaisha, Tokyo, Japan

[21] Appl. No.: 132,646

[22] Filed: Dec. 8, 1987

[30] Foreign Application Priority Data

Feb. 10, 1987 [JP] Japan ................................. 62-28782

[51] Int. Cl.$^5$ .................... G11C 7/00; G11C 11/40
[52] U.S. Cl. .............................. 365/189.06; 365/203; 365/222; 365/233; 365/206
[58] Field of Search ............... 365/189, 203, 205, 206, 365/207, 222, 233, 189.01, 189.06, 230.03

[56] References Cited

U.S. PATENT DOCUMENTS

| | | | |
|---|---|---|---|
| 4,122,546 | 10/1978 | von Basse | 365/205 X |
| 4,520,465 | 5/1985 | Sood | 365/203 |
| 4,528,646 | 7/1985 | Ochii et al. | 365/203 |
| 4,584,672 | 4/1986 | Schutz et al. | 365/203 |
| 4,656,613 | 4/1987 | Norwood | 365/203 X |
| 4,722,074 | 1/1988 | Fujishima et al. | 365/203 |
| 4,740,926 | 4/1988 | Takemae et al. | 365/203 |

FOREIGN PATENT DOCUMENTS

| | | |
|---|---|---|
| 0071245 | 7/1982 | European Pat. Off. |
| 0165106 | 5/1985 | European Pat. Off. |
| 0185572 | 11/1985 | European Pat. Off. |
| 2117565A | 4/1982 | United Kingdom |
| 2127246A | 6/1983 | United Kingdom |

OTHER PUBLICATIONS

L. Arzubi, "Bit Line Cascading in Semiconductor Storage Chips", IBM Technical Disclosure Bulletin, vol. 22, No. 8B, Jan. 1980.
ISCC Digest of Technical Papers 1984, pp. 279-279 of Roger I. Kung et al.

Primary Examiner—Stuart N. Hecker
Assistant Examiner—Alyssa H. Bowler
Attorney, Agent, or Firm—Lowe, Price, LeBlanc and Becker

[57] ABSTRACT

A dynamic random access memory with a folded bit line structure ($BLL_{j1}$, $\overline{BLL_{j1}}$, $BLR_{j1}$ $\overline{BLR_{j1}}$), each pair of bit lines being divided into a plurality of blocks ($MCB_{j1}$, $MCB_{j2}$), comprises equalizing transistors ($Q_{j9}$, $Q_{j10}$) each of which is provided for each pair of divided bit lines to equalize the pair of divided bit lines. The equalizing transistors ($Q_{j9}$, $Q_{j10}$) stop equalizing selectively and at different times among the blocks.

16 Claims, 12 Drawing Sheets

DYNAMIC RANDOM ACCESS MEMORY WITH FET EQUALIZATION OF BIT LINES

BACKGROUND OF THE INVENTION

1. Field of the Invention

The present invention relates to a dynamic random access memory (hereinafter referred to as DRAM), and more particularly, it relates to a CMOS-DRAM employing a ($\frac{1}{2}$) $V_{CC}$ precharge system, i.e., a system of precharging bit lines at ($\frac{1}{2}$) $V_{CC}$ by equalizing means.

2. Description of the Prior Art

A dynamic RAM generally comprises memory cell array blocks. Each of the blocks has a plurality of memory cells, and each of the memory cells is formed by a transistor and a capacitor. As the ratio of the capacitance of a bit line to that of the capacitor of the memory cell is decreased, potential variation of the bit line in data reading is increased so that input potential difference for a sense amplifier is increased, whereby a read operation is reliably performed.

However, the memory cell size is reduced as a memory having a larger capacity is implemented with higher density of integration, whereby the memory cell capacitance is decreased while the number of memory cells connected to a bit line is increased. Therefore, the bit line is enlarged in length and the capacitance thereof is increased. Thus, the ratio of the bit line capacitance to the memory cell capacitance may be so increased that a read operation cannot be reliably performed. In order to solve such a problem, there is an attempt to divide a bit line into a plurality of blocks to reduce the ratio of the bit line capacitance to the memory cell capacitance.

FIG. 1 shows the entire structure of a conventional basic DRAM.

Referring to FIG. 1, the conventional DRAM comprises a memory part 1 including a memory cell array formed by a plurality of memory cells arrayed in the form of a matrix, a row decoder for selecting a row from the memory cell array and a column decoder for selecting a column from the memory cell array. Provided as peripheral circuits are a clock generation circuit 2 for generating various operation timing signals in response to an externally supplied clock signal $\overline{RAS}$, an address buffer 3 for strobing externally supplied address signals $A_0$ to $A_n$ in response to a control signal (internal $\overline{RAS}$) from the clock generation circuit 2 to generate an internal address signal and supply the same to the row decoder and the column decoder of the memory part 1, a data input buffer 4 for receiving input data $D_{IN}$ in response to a control signal from the clock generation circuit 2 and transmitting the same to the memory part 1 and a data output buffer 5 for receiving data read from the memory part 1 in response to a control signal from the clock generation circuit 2 and transferring output data $D_{OUT}$ to the exterior.

The clock signal $\overline{RAS}$ is supplied to a terminal 10. The external address signals $A_0$ to $A_n$ are supplied to terminals 11-0 to 11-n, respectively. The input data $D_{IN}$ is supplied to a terminal 12. The output data $D_{OUT}$ is transmitted from a terminal 13 to the exterior of the DRAM. A power terminal 14 for receiving supply voltage $V_{CC}$ and a ground terminal 15 connected to a ground potential $V_{SS}$ are further provided in order to supply operating voltage to the DRAM. The memory part 1 and the peripheral circuits are integrated on a semiconductor chip 16.

FIG. 2 shows exemplary structure of the memory part 1 of the DRAM as shown in FIG. 1.

Referring to FIG. 2, the memory cell array is divided into eight memory cell array blocks $ML_1$, $ML_2$, $ML_3$ and $ML_4$ and $MR_1$, $MR_2$, $MR_3$ and $MR_4$. A column decoder is provided for four memory cell array blocks. Namely, a column decoder CL is provided for the left memory cell array blocks $ML_1$ to $ML_4$ and another column decoder CR is provided for the right memory cell array blocks $MR_1$ to $MR_4$.

A shared sense amplifier block $NSL_1$ is provided between the memory cell array blocks $ML_1$ and $ML_2$. Respective bit lines of the memory cell array blocks $ML_1$ and $ML_2$ are connected with each other through the shared sense amplifier block $NSL_1$, to form one bit line. A sense amplifier block $PSL_1$ is provided to detect and amplify information on each bit line of the memory cell array block $ML_1$, and a sense amplifier +I/O block $PIL_1$ is provided between the column decoder CL and the memory cell array block $ML_2$ in order to detect and amplify information on each bit line of the memory cell array block $ML_2$.

The information on each bit line of the memory cell array block $ML_1$ is detected and amplified by respective amplifiers of the sense amplifier block $PSL_1$ and the shared sense amplifier block $NSL_1$. The information on each bit line of the memory cell array block $ML_2$ is detected and amplified by respective amplifiers of the shared sense amplifier block $NSL_1$ and the sense amplifier +I/O block $PIL_1$. One of the bit lines of the memory cell array blocks $ML_1$ and $ML_2$ is connected to a data input/output bus through an I/O gate in the sense amplifier +I/O block $PIL_1$ by output of the column decoder CL.

The remaining memory cell array blocks $ML_3$ and $ML_4$ are arranged in a similar manner to the above. Namely, a sense amplifier +I/O block $PIL_2$ is provided between the column decoder CL and the memory cell array block $ML_3$ and a shared sense amplifier block $NSL_2$ is provided between the memory cell array blocks $ML_3$ and $ML_4$ while a sense amplifier block $PSL_2$ is provided on the right end of the memory cell array block $ML_4$.

The right memory cell array blocks $MR_1$ to $MR_4$ are arranged symmetrically to the left memory cell array blocks $ML_1$ to $ML_4$. A sense amplifier block $PSR_1$ is provided for the memory cell array block $MR_1$, and a shared sense amplifier block $NSR_1$ is provided between the memory cell array blocks $MR_1$ and $MR_2$. A sense amplifier +I/O block $PIR_2$ is provided between the memory cell array block $MR_2$ and the column decoder CR. A sense amplifier +I/O block $PIR_2$ is provided between the column decoder CR and the memory cell array block $MR_3$. A shared sense amplifier block $NSR_2$ is provided between the memory cell array blocks $MR_3$ and $MR_4$, and a sense amplifier block $PSR_2$ is provided on the right end of the memory cell array block $MR_4$. Operation of each right block is functionally similar to that of the corresponding one of the left blocks.

A row decoder RD is provided for selecting a word line (a row) from the memory cell array blocks $ML_1$ to $ML_4$ and $MR_1$ to $MR_4$.

Description is now made on the structure of a bit line part selected by one of column decoder output, i.e., the structure of an adjacent pair of memory cell array blocks and a sense amplifier provided for the same.

FIG. 3 illustrates the structure of a bit line pair and a CMOS sense amplifier part of a conventional DRAM as described in, e.g., ISSCC Digest of Technical Papers 1984, pp. 278 to 279. This DRAM employs the so-called shared sense amplifier structure in which each bit line is divided into a pair of divided bit lines to commonly share a sense amplifier with a divided bit line pair provided on both sides of the same. Although transistors of memory cells are formed by P-channel FETs and the shared sense amplifier is formed by P-channel FETs and sense amplifiers on both ends are formed by N-channel FETs in the structure described in the aforementioned literature, such FETs are reversed in conductivity type and the operation is slightly simplified in FIG. 3, for convenience of illustration.

Referring to FIG. 3, symbols $MCB_{j1}$ and $MCB_{j2}$ indicate memory cell array blocks, each of which includes a plurality of word lines, a plurality of divided bit line pairs, memory cells, potential difference amplifying means and equalizing means. Bit lines forming folded bit lines are divided into bit line pairs $BLL_j$, $\overline{BLL}_j$ and $BLR_j$, $\overline{BLR}_j$ respectively. Cross-coupled FETs $Q_{j1}$ and $Q_{j2}$ form an N-channel sense amplifier (potential difference amplifying means) $NSA_j$, which is shared with the memory cell array blocks $MCB_{j1}$ and $MCB_{j2}$. Similarly cross-coupled FETs $Q_{j5}$, $Q_{j6}$ and $Q_{j7}$, $Q_{j8}$ are adapted to form P-channel sense amplifiers (potential difference amplifying means) $PSA_{jL}$ and $PSA_{jR}$, respectively. The sources of the FETs $Q_{j1}$ and $Q_{j2}$ are commonly connected to the drain of an FET $Q_N$, whose gate and source are connected to an N-channel sense amplifier driving signal $S_N$ and a ground potential $V_{SS}$, respectively. The sources of the FETs $Q_{j5}$, $Q_{j6}$ and $Q_{j7}$, $Q_{j8}$ are commonly connected to the drains of FETs $Q_{PL}$ and $Q_{PR}$ respectively, while the gate and the source of the FET $Q_{PL}$ are connected to a P-channel sense amplifier driving signal $S_{PL}$ and a supply potential $V_{CC}$ respectively, and the gate and the source of the FET $Q_{PR}$ are connected to a P-channel sense amplifier driving signal $S_{PR}$ and a supply potential $V_{CC}$, respectively.

The P-channel sense amplifier $\overline{PSA}_{jL}$ is connected to the divided bit lines $BLL_j$ and $BLL_j$ and the P-channel sense amplifier $\overline{PSA}_{jR}$ is connected to the divided bit lines $BLR_j$ and $BLR_j$. Transfer gate FETs $Q_{j11}$ and $Q_{j12}$ are provided between the divided bit lines $BLL_j$ and $\overline{BLL}_j$ and the N-channel sense amplifier $NSA_j$ while transfer gate FETs $Q_{j13}$ and $Q_{j14}$ are provided between the divided bit lines $BLR_j$ and $\overline{BLR}_j$ and the N-channel sense amplifier $NSA_j$. The gates of the FETs $Q_{j11}$, $Q_{j12}$ and $Q_{j13}$, $Q_{j14}$ receive the transfer signals SL and SR, respectively. FETs $Q_{j9}$ and $Q_{j10}$ are provided for equalizing the divided bit line pairs $BLL_j$, $\overline{BLL}_j$ and $BLR_j$, $\overline{BLR}_j$, respectively, and the gates thereof receive equalizing signals EQ.

The divided bit lines $BLR_j$ and $\overline{BLR}_j$ are connected to bus lines BU and $\overline{BU}$, respectively, through column gate FETs $Q_{j15}$ and $Q_{j16}$, whose gates are connected to a column selecting signal $Y_j$. Although a plurality of memory cells are generally connected to such divided bit lines in accordance with memory capacity, for simplicity is represented a memory cell $MC_{ij}$ connected to the divided bit line $BLL_j$ in FIG. 3. The memory cell $MC_{ij}$ is formed by a capacitor $C_{ij}$ and an FET $Q_{ij}$, and the gate of the FET $Q_{ij}$ is connected to a word line $WL_i$. An electrode of the capacitor $C_{ij}$ is connected to a memory cell plate potential $V_{SG}$.

Description is now made on an operation of the CMOS sense amplifier structure as shown in FIG. 3 in the case of reading data "1" stored in the capacitor $C_{ij}$ of the memory cell $MC_{ij}$, with reference to FIG. 4 showing an operating waveform diagram.

The DRAM enters an activated state on the falling edge of an external $\overline{RAS}$ signal (hereinafter referred to as Ext. RAS signal) as shown in FIG. 4. In this activated state, an external row address signal is latched in the interior of the chip on the falling edge of the Ext. $\overline{RAS}$ signal. Then the equalizing signal EQ and the transfer signal SR are turned to low levels to stop equalization of the divided bit lines $BLL_j$, $\overline{BLL}_j$ and $BLR_j$, $\overline{BLR}_j$ while separating the divided bit lines $BLR_j$ and $\overline{BLR}_j$ from the N-channel sense amplifier NSA. At this time, the transfer signal SL is maintained at a high level.

Then, a potential of a word line selected in response to the row address signal latched in the chip interior goes high. It is assumed here that the word line $WL_i$ of FIG. 3 is selected. When the potential of the word line $WL_i$ thus goes high, the FET $Q_{ij}$ enters an ON state so that the charge stored in the capacitor $C_{ij}$ is transferred to the divided bit line $BLL_j$, whereby the potential of the divided bit line $BLL_j$ exceeds the level as is equalized, i.e., $(V_{CC}-V_{SS})/2$. Then, the sense amplifier driving signals $S_N$ and $S_{PL}$ are turned to high and low levels, respectively, whereby the FETs $Q_N$ and $Q_{PL}$ are turned on so that the N-channel sense amplifier $NSA_j$ and the P-channel sense amplifier $PSA_{jL}$ operate to amplify the potential difference between the divided bit lines $BLL_j$ and $\overline{BLL}_j$.

Then, the transfer signal SR again goes high so that the potentials of the divided bit lines $BLL_j$ and $\overline{BLL}_j$ are transferred to the divided bit lines $BLR_j$ and $\overline{BLR}_j$. As the result, the potentials of the divided bit lines $BLR_j$ and $\overline{BLR}_j$ go high and low, respectively. Then, the sense amplifier driving signal $S_{PR}$ goes low and the FET $Q_{PR}$ enters an ON state so that the P-channel sense amplifier $PSA_{jR}$ operates, whereby the potential of the divided bit line $BLR_j$ is raised to a higher level. Then, the column selecting signal $Y_j$ goes high so that the potentials of the divided bit lines $BLR_j$ and $\overline{BLR}_j$ are transferred to the bus lines BU and $\overline{BU}$, whereby the data "1" stored in the capacitor $C_{ij}$ of the memory cell $MC_{ij}$ is read out.

When the Ext. $\overline{RAS}$ signal goes high so that the DRAM enters an inactivated state, the potential of the selected word line $WL_i$ goes low and the FET $Q_{ij}$ in the memory $MC_{cj}$ enters an OFF state. Then the sense amplifier driving signal $S_N$ is turned to a low level and the signals $S_{PL}$ and $S_{PR}$ are turned to high levels. Further, the equalizing signals EQ and the transfer signals SL and SR are turned to high levels, whereby the divided bit lines $BLL_j$, $\overline{BLL}_j$ and $BLR_j$ and $\overline{BLR}_j$ are equalized so that the respective potentials thereof are averaged to the level of $(V_{CC}-V_{SS})/2$, while the paired divided bit lines are connected with each other at the same time.

The aforementioned various control signals are produced by circuits as shown in FIG. 5. Description is now made on the structure of each control signal producing circuit.

The equalizing signal EQ is produced by a delay circuit 51 for delaying the clock signal $\overline{RAS}$ by a predetermined time $t_2$ and an equalizing signal generator 52 formed by a buffer for waveform-shaping output from the delay circuit 51 and outputting the same.

A word line driving signal $WL_i$ is produced by a row decoder 53. The row decoder 53 decodes an internal row address from an address buffer 54 for receiving an external address and producing an internal address to select a word line $WL_i$, thereby to make the potential of the selected word line rise in response to a signal from a delay circuit 55 for delaying the clock signal $\overline{RAS}$ by a time $t_3$.

The NMOS sense amplifier driving signal $S_N$ is produced by a delay circuit 56 for delaying the word line driving signal $WL_i$ by a time $t_4$ and outputting the same and an NMOS sense amplifier driving signal generator 57 formed by a buffer for waveform-shaping output from the delay circuit 56 and outputting the same.

The transfer signal SL is produced by a left transfer signal generator 60 activated in response to a block selecting address from the address buffer 54 for generating a signal which falls in response to a signal from a delay circuit 58 for delaying the clock signal $\overline{RAS}$ by a time $t_1$ while rising in response to output from a delay circuit 59 for delaying the NMOS sense amplifier driving signal $S_N$ by a time $t_6$.

The transfer signal SR is produced by a right transfer signal generator 61 activated in response to a block selecting address from the address buffer 54 for generating a signal which falls in response to the output from the delay circuit 58 while rising in response to the output from the delay circuit 59.

The PMOS sense amplifier driving signal $S_{PL}$ is produced by a left PMOS sense amplifier driving circuit 64 activated in response to a block selecting address from the address buffer 54 for generating a signal which goes low in response to either output from a delay circuit 62 for delaying the sense amplifier driving signal $S_N$ by a time $t_5$ or output from a delay circuit 63 for delaying the sense amplifier driving signal $S_N$ by a time $t_7$.

The PMOS sense amplifier driving signal $S_{PR}$ is produced by a right PMOS sense amplifier activating circuit 65 activated by a block selecting address from the address buffer 54 for generating a signal which falls in response to either output from the delay circuit 62 or 63.

The falling timing of the sense amplifier driving signals $S_{PL}$ and $S_{PR}$ is determined by the block selecting address.

The column selecting signal $Y_j$ is produced by a column decoder 67. The column decoder 67 decodes a column address from the address buffer 54 to generate a signal $Y_j$ which rises in response to output of a delay circuit 66 for delaying the NMOS sense amplifier driving signal $S_N$ by a time $t_8$ to select a pair of bit lines and connect the same to the data input/output buses BU and $\overline{BU}$.

When the word line $WL_i$ in the left-side block is selected in the conventional dynamic random access memory as hereinabove described, the data stored in the memory cell is first read on the divided bit lines $BLL_j$ and $BLL_j$, to be then transferred to the divided bit lines $BLR_j$ and $BLr_j$. On the other hand, since the left and right divided bit line pairs $BLL_j$, $BLL_j$ and $BLR_j$ are equalized by the same signals EQ, equalization of these divided bit line pairs is simultaneously stopped. Consequently, when a word line in the left memory block is selected, the right-side divided bit lines $BLR_j$ and $BLR_j$ enter electrically floating states after the equalizing signal EQ goes low, to be maintained in such states until the transfer signal SR again goes high. Such an interval is about 5 to 15 nsec. in general. In this interval, the left-side divided bit lines $BLL_j$ and $BLL_j$ perform a sensing operation. During the sensing operation, one of the divided bit lines $BLL_j$ and $BLL_j$, i.e., $BLL_j$ in this case, is discharged to the ground potential $V_{SS}$ while the other one, i.e., $BLL_j$ in this case, is charged to the power supply potential $V_{CC}$. Such sensing operation is simultaneously performed in a number of divided bit line pairs coupled to memory cells which are connected to the selected word line $WL_i$, whereby the levels of the ground potential $V_{SS}$ and the supply potential $V_{CC}$ are varied to cause noise. The right-side divided bit lines $BLR_j$ and $BLR_j$ are in floating states at the time when such noise is caused, to be subjected to potential deviation by such noise.

When the divided bit lines $BLR_j$ and $BLR_j$ are affected by noise in a direction opposite to the potentials to be originally effected, it takes time to discharge and charge the divided bit lines $BLR_j$ and $BLR_j$, respectively, whereby the sensing time is increased by $\Delta t$ as compared with the case in which no such noise is produced, to delay the access time.

A method of equalizing a bit line pair is described in U.S. Pat. No. 4,397,003 to Wilson et al., for example. However, this prior art takes no account of a divided bit line pair or noise applied to the divided bit line pair.

As a relevant prior art, there exist U.S. patent application Ser. Nos. 014837, 020192 and 027536 by the same applicant. These prior art disclose a DRAM having a divided line pair structure and the same equalizing timing.

SUMMARY OF THE INVENTION

The present invention has been proposed to overcome the aforementioned disadvantage, and an object thereof is to provide a high-speed dynamic RAM having large operating margins, which can prevent potentials of a pair of divided bit lines from being unbalanced before starting of sensing operation for the paired divided bit lines.

In the dynamic random access memory according to the present invention, bit lines are divided into a plurality of divided bit line pair by switching means while equalizing FETs are provided for the respective divided bit line pairs, so that timings for stopping equalization by the equalizing FETs are made to be different for each of memory cell array blocks including the divided bit line pairs.

The timings for stopping equalization of the divided bit line pairs are made to be different for each of the memory cell array blocks including the divided bit line pairs in the dynamic random access memory according to the present invention, whereby the floating time of each divided bit line pair before starting of sensing operation is reduced to prevent increase in sensing time due to potential difference caused in the divided bit line pair by noise originating in sensing operation of other divided bit line pair.

These and other objects, features, aspects and advantages of the present invention will become more apparent from the following detailed description of the present invention when taken in conjunction with the accompanying drawings.

DESCRIPTION OF THE PREFERRED EMBODIMENTS

Description is now made of embodiments of the present invention with reference to the accompanying drawings.

Figure 1:
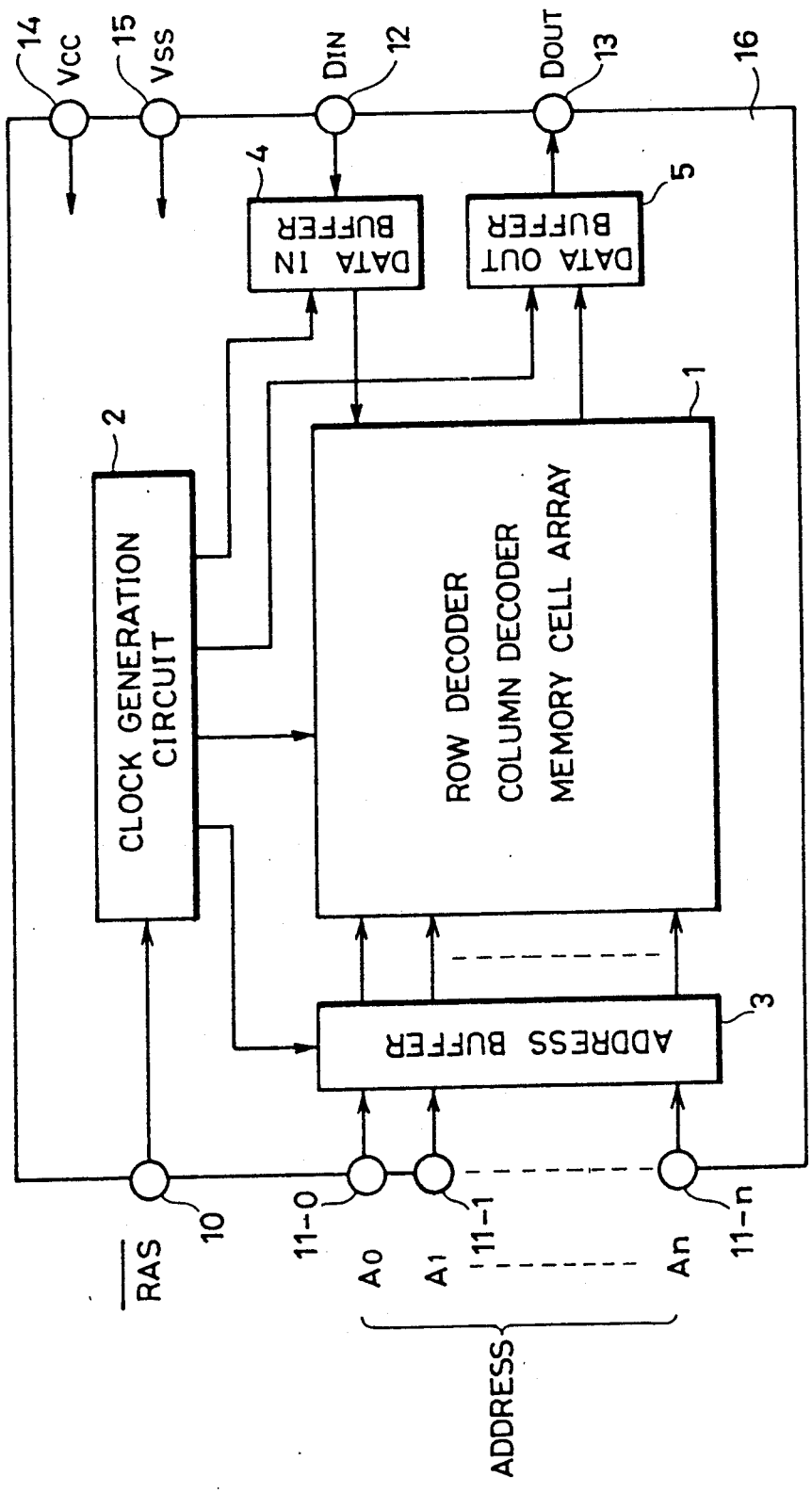
FIG. 1 schematically illustrates the entire structure of a conventional DRAM.
Figure 2:
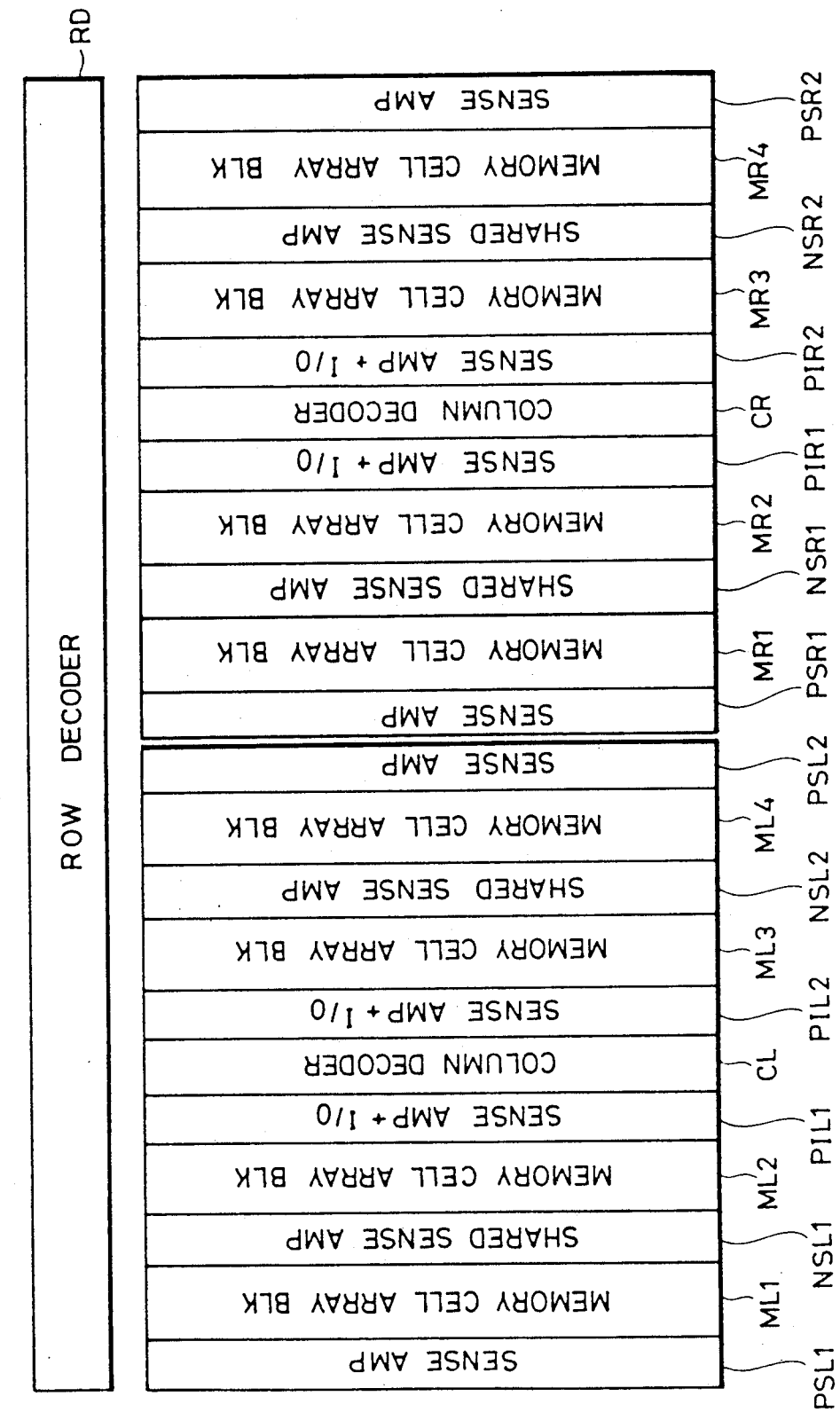
FIG. 2 schematically illustrates the structure of a memory part of the conventional DRAM.
Figure 3:
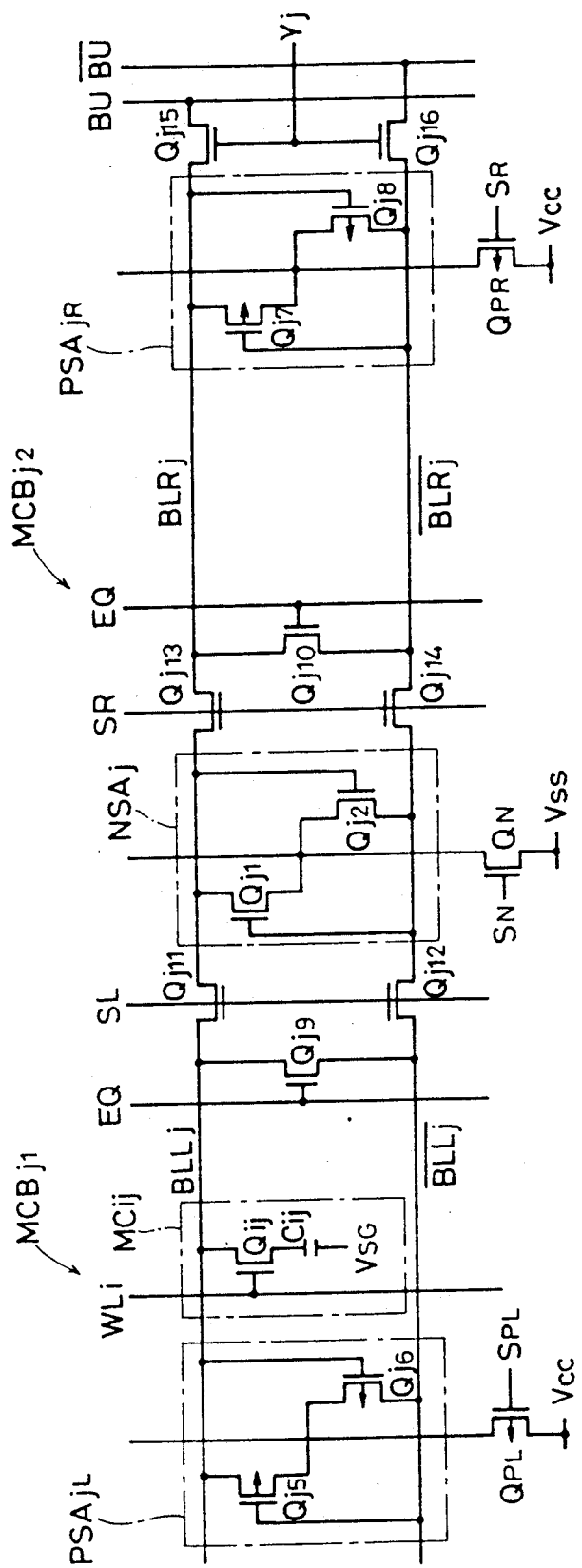
FIG. 3 specifically illustrates the structure of a bit line part of a memory cell array of the conventional DRAM.
Figure 4:
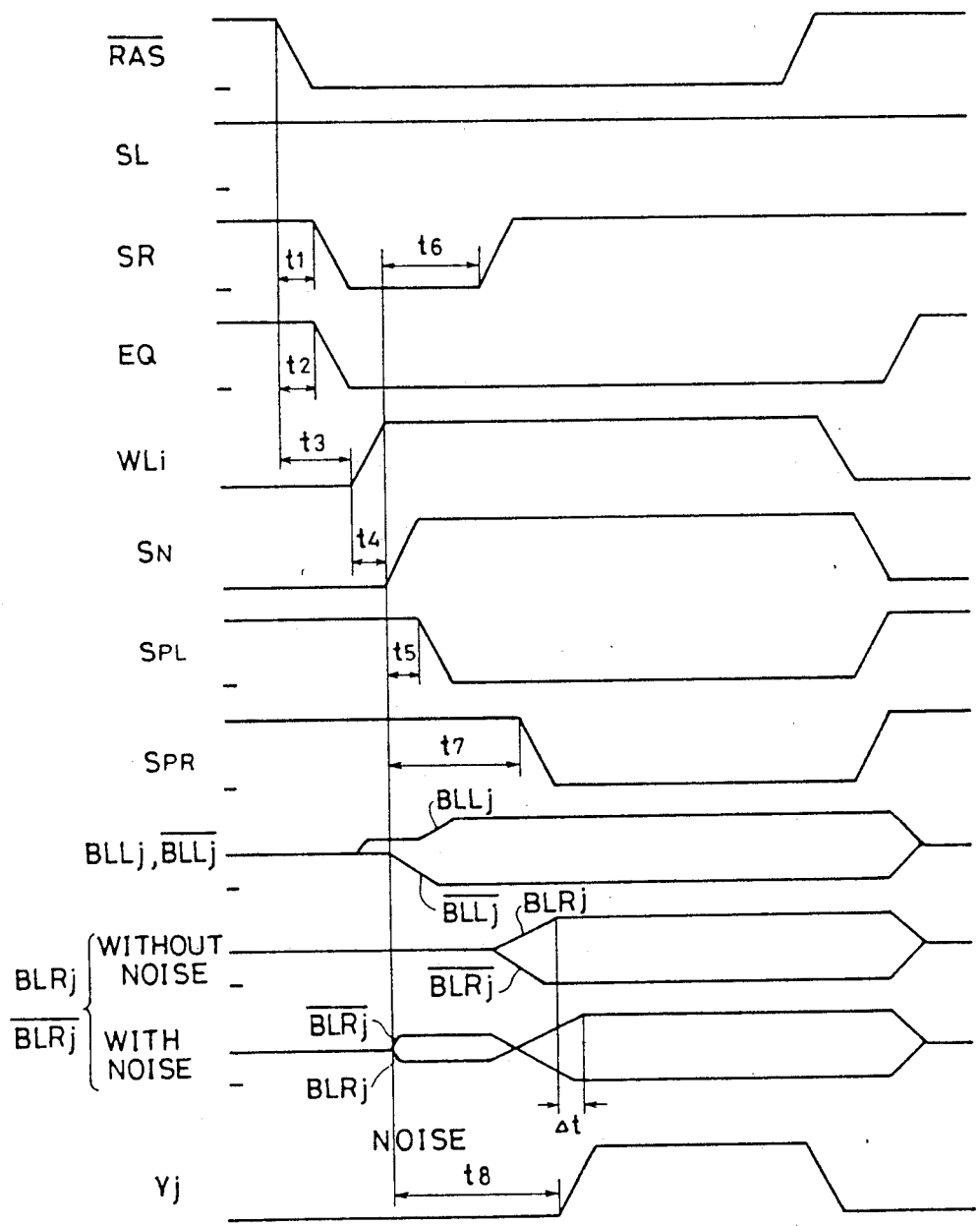
FIG. 4 is a waveform diagram showing sensing operation of the conventional DRAM.
Figure 5:
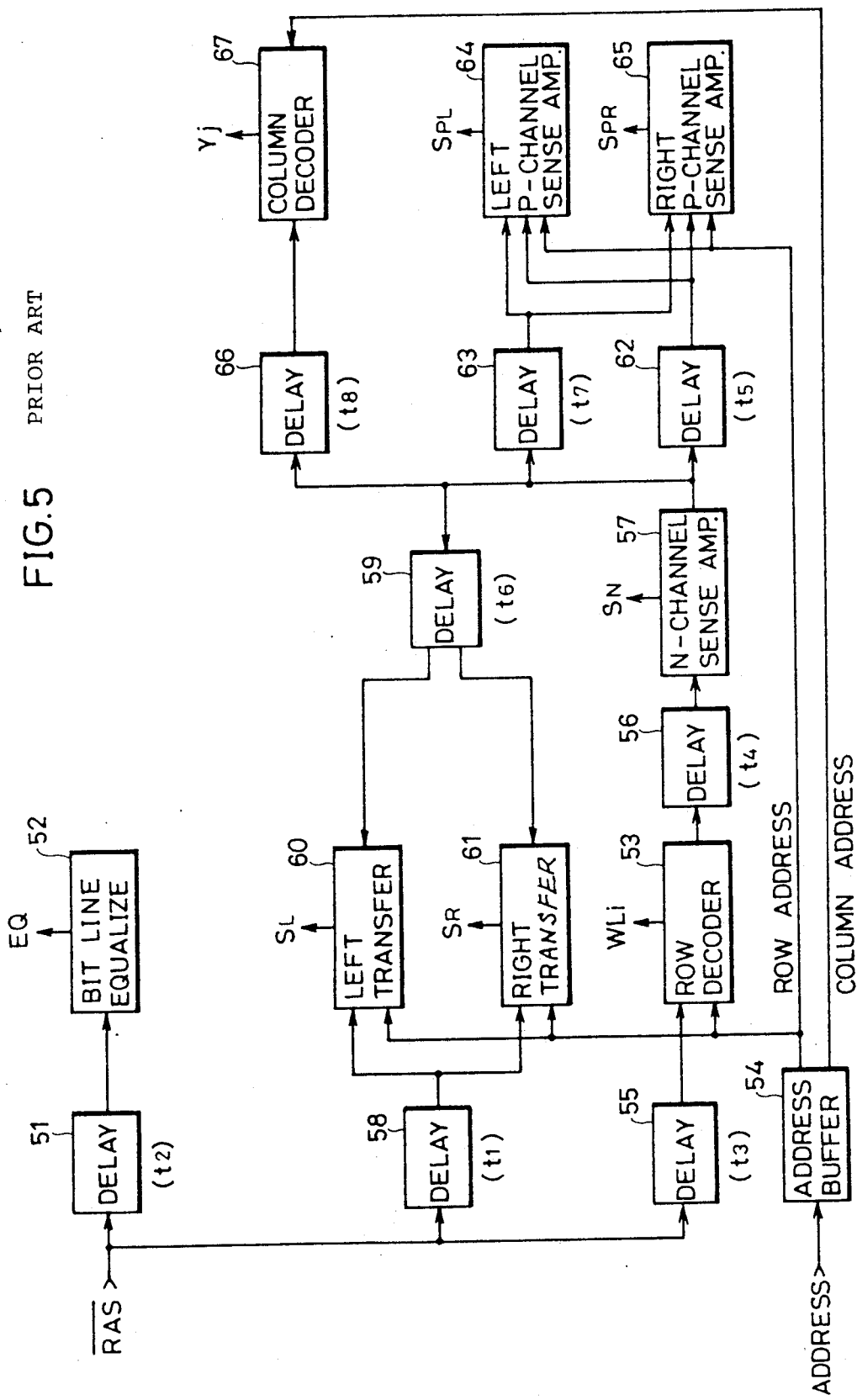
FIG. 5 illustrates the structure of respective control signal producing circuits of the conventional DRAM.
Figure 6:
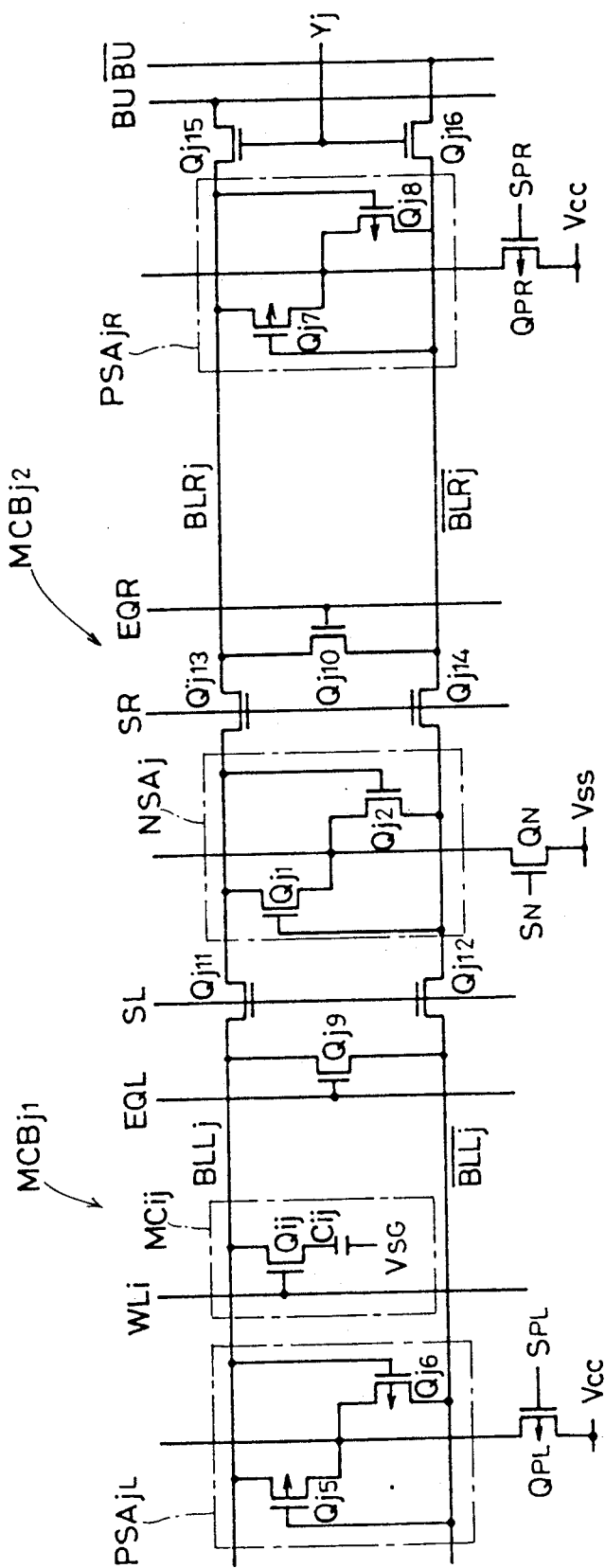
FIG. 6 illustrates the structure of a bit line part of a memory cell array of a DRAM according to an embodiment of the present invention.

FIG. 6 illustrates the structure of a CMOS sense amplifier part and a paired bit line of a dynamic random access memory according to an embodiment of the present invention. Referring to FIG. 6, a bit line pair forming a folded bit line is divided into bit line pairs $BLL_j$, $\overline{BLL}_j$ and $BLR_j$, $\overline{BLR}_j$ by transfer gate FETs (switching means) $Q_{j11}$, $Q_{j12}$ and $Q_{j13}$, $Q_{j14}$. Namely, the bit line pair is divided into two bit line pairs. An N-channel sense amplifier $NSA_j$ is formed by cross-coupled FETs $Q_{j1}$ and $Q_{j2}$ and P-channel sense amplifiers $PSA_{jL}$ and $PSA_{jR}$ are formed by cross-coupled FETs $Q_{j5}$, $Q_{j6}$ and $Q_{j7}$, $Q_{j8}$, respectively. The sources of the FETs $Q_{j1}$ and $Q_{j2}$ are commonly connected to the drain of an FET $Q_N$ which in turn has a gate and a source connected to an N-channel sense amplifier driving signal $S_N$ and a ground potential $V_{SS}$, respectively. The sources of the FETs $Q_{j5}$, $Q_{j6}$ and $Q_{j7}$, $Q_{j8}$ are commonly connected to the drains of FETs $Q_{PL}$ and $Q_{PR}$, respectively, while the gate and the source of the FET $Q_{PL}$ are connected to receive a P-channel sense amplifier driving signal $S_{PL}$ and a supply potential $V_{CC}$, respectively, and the gate and the source of the FET $Q_{PR}$ are connected to receive a P-channel sense amplifier driving signal $S_{PR}$ and a supply potential $V_{CC}$.

The P-channel sense amplifier $PSA_{jL}$ is provided for the divided bit line pair $BLL_j$ and $\overline{BLL}_j$ while the P-channel sense amplifier $PSA_{jR}$ is provided for the divided bit line pair $BLR_j$ and $\overline{BLR}_j$. Transfer gate FETs $Q_{j11}$ and $Q_{j12}$ are provided between the divided bit lines $BLL_j$ and $\overline{BLL}_j$ and the N-channel sense amplifier $NSA_j$, while transfer gate FETs $Q_{j13}$ and $Q_{j14}$ are provided between the divided bit lines $BLR_j$ and $\overline{BLR}_j$ and the N-channel sense amplifier $NSA_j$. Transfer signals SL and SR are supplied to the gates of the FETs $Q_{j11}$, $Q_{j12}$ and $Q_{j13}$, $Q_{j14}$, respectively. FETs $Q_{j9}$ and $Q_{j10}$ are adapted to equalize the divided bit line pairs $BLL_j$, $\overline{BLL}_j$ and $BLR_j$, $\overline{BLR}_j$, respectively, and the gates thereof are connected with equalizing signals EQL and EQR, respectively. The divided bit lines $BLR_j$ and $\overline{BLR}_j$ are connected to bus lines BU and $\overline{BU}$ through column gate FETs $Q_{j15}$ and $Q_{j16}$, whose gates are connected with a column selecting signal $Y_j$. Although a plurality of memory cells are connected to the divided bit lines in accordance with memory capacity, for simplicity is represented a memory cell $MC_{ij}$ connected to the divided bit line $BLL_j$ in FIG. 6. The memory cell $MC_{ij}$ is formed by a capacitor $C_{ij}$ and an FET $Q_{ij}$, while the gate of the FET $Q_{ij}$ is connected to a word line $WL_i$. An electrode of the capacitor $C_{ij}$ is connected to a memory cell plate potential $V_{SG}$.

Figure 7:
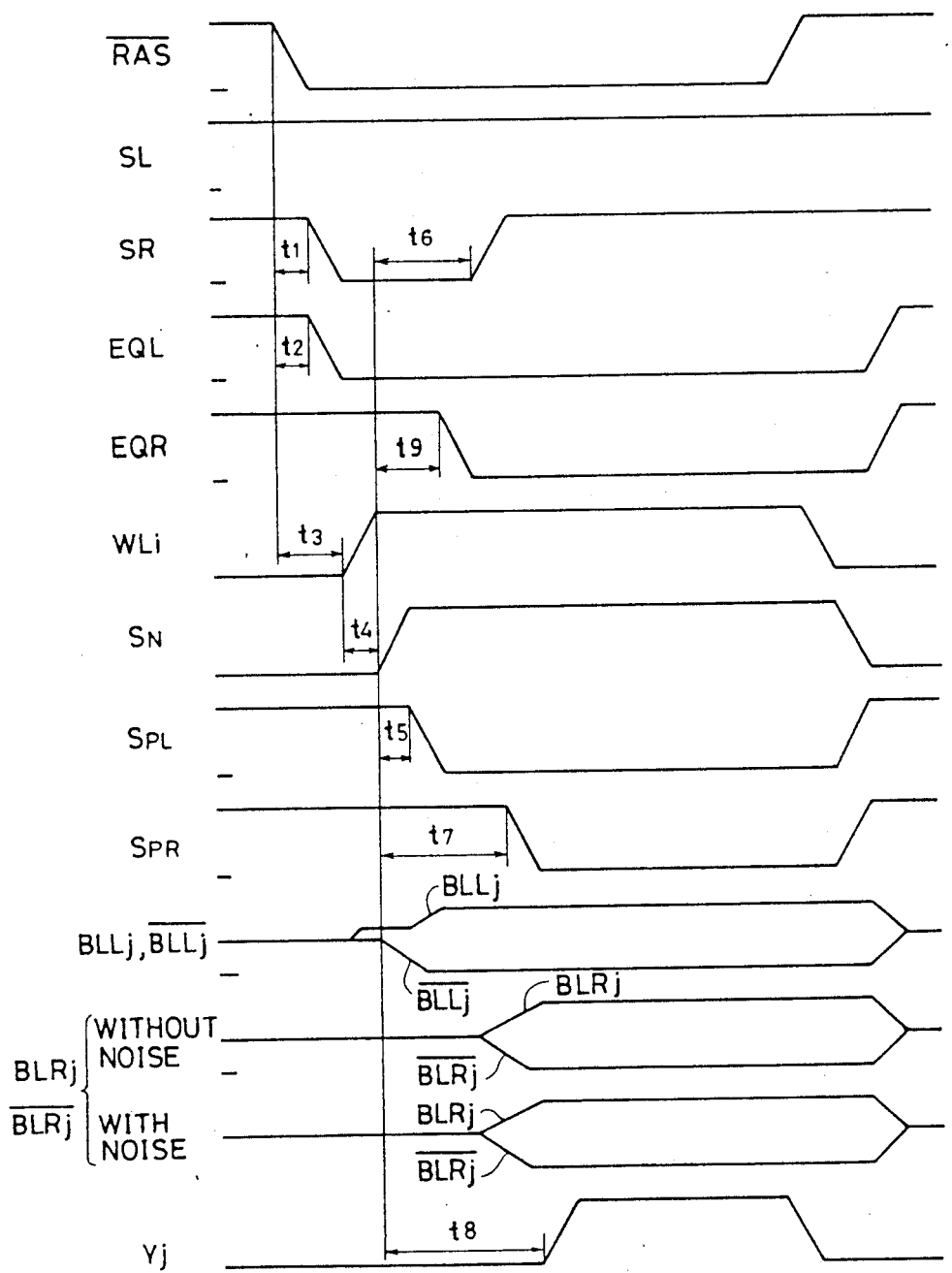
FIG. 7 is a waveform diagram showing sensing operation of the DRAM as shown in FIG. 6.

Description is now made of operation of the CMOS sense amplifier part as shown in FIG. 6 in the case of reading data "1" stored in the capacitor $C_{ij}$ of the memory cell $MC_{ij}$, with reference to FIG. 7 showing an operating waveform diagram.

The DRAM enters an activated state on the falling edge of an Ext. $\overline{RAS}$ signal as shown in FIG. 7. In this activated state, an external row address signal is latched in the chip interior on the falling edge of the Ext. $\overline{RAS}$ signal. Then the equalizing signal EQL and the transfer signal SR are turned to low levels to stop equalization of the divided bit lines $BLL_j$ and $\overline{BLL}_j$ while separating the divided bit lines $BLR_j$ and $\overline{BLR}_j$ from the N-channel sense amplifier $NSA_j$. The transfer signal SL and the equalizing signal EQR are maintained at high levels at this time.

Then, a potential of a word line selected in response to the row address signal latched in the chip interior is turned to a high level. It is assumed that the word line $WL_i$ is selected in FIG. 6. When the potential of the word line $WL_i$ thus goes high, the FET $Q_{ij}$ in the memory cell $MC_{ij}$ enters an ON state so that the charge stored in the capacitor $C_{ij}$ is transferred to the divided bit line $BLL_j$, whereby the potential of the divided bit line $BLL_j$ exceeds the level as is equalized, i.e., $(V_{CC}-V_{SS})/2$. Then the sense amplifier driving signals $S_N$ and $S_{PL}$ are turned to high and low levels, respectively, whereby the FETs $Q_N$ and $Q_{PL}$ enter ON states so that the N-channel sense amplifier $NSA_j$ and the P-channel sense amplifier $PSA_{jL}$ operate to amplify the potential difference between the paired divided bit lines $BLL_j$ and $\overline{BLL}_j$. Although noise is produced at this time as hereinabove described with reference to the prior art, no potential difference is introduced in the right-side divided bit line pair $BLR_j$ and $\overline{BLR}_j$, since the same are continuously equalized as shown in FIG. 7.

Then the equalizing signal EQR goes low to stop equalization of the paired divided bit lines $BLR_j$ and $\overline{BLR}_j$. Further, the transfer signal SR again goes high so that the potentials of the divided bit lines $BLL_j$ and $\overline{BLL}_j$ are transferred to the divided bit lines $BLR_j$ and $\overline{BLR}_j$, respectively. As a result, the potentials of the divided bit lines $BLR_j$ and $\overline{BLR}_j$ go high and low, respectively. Then the sense amplifier driving signal $S_{PR}$ goes low and the FET $Q_{PR}$ enters an ON state so that the P-channel sense amplifier $PSA_{jR}$ operates to raise the potential of the divided bit line $BLR_j$ to a higher level. Then the column selecting signal $Y_j$ goes high and the potentials of the divided bit lines $BLR_j$ and $\overline{BLR}_j$ are transferred to the bus lines BU and $\overline{BU}$, whereby the data "1" stored in the capacitor $C_{ij}$ of the memory cell $MC_{ij}$ is read out.

When the Ext. RAS signal goes high so that the DRAM enters an inactivated state, the potential of the selected word line $WL_i$ goes low and the FET $Q_{ij}$ enters an OFF state. Then the sense amplifier driving signal $S_N$ is turned to a low level and the signals $S_{PL}$ and $S_{PR}$ are turned to high levels. Further, the equalizing signals EQL and EQR and the transfer signals SL and SR are turned to high levels, whereby the divided bit lines BLL$_j$, BLL$_j$ and BLR$_j$, BLR$_j$ are equalized and the respective potentials thereof are averaged to the level of (V$_{CC}$−V$_{SS}$)/2, while the divided bit lines are connected with each other at the same time.

Figure 8:
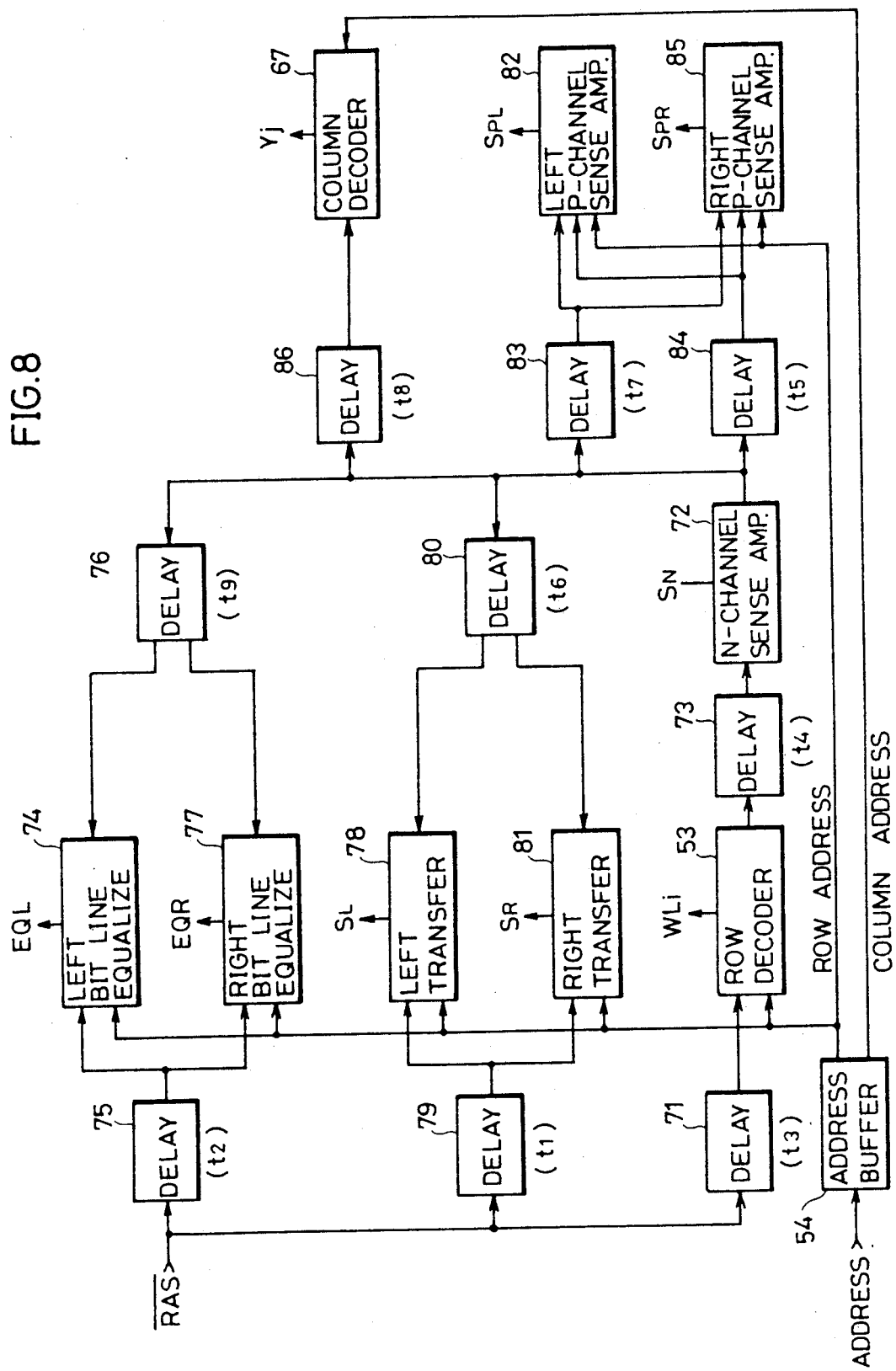
FIG. 8 is a block diagram showing circuits for producing signals for controlling the operation of the DRAM as shown in FIG. 6.

FIG. 8 shows the structure of circuits for producing the control signals as shown in FIGS. 6 and 7. Referring to FIG. 8, description is now made on the circuits for producing the control signals.

A word line driving signal WL$_i$ is produced by a row decoder 53. This row decoder 53 decodes a row address from an address buffer 54 to make the potential of a selected word line rise in response to output from a delay circuit 71. The delay circuit 71 delays the clock signal RAS by a time t$_3$ and outputs the same. Thus, the word line driving signal WL$_i$ rises after a lapse of the time t$_3$ from falling of the clock signal $\overline{RAS}$.

The NMOS sense amplifier driving signal S$_N$ is produced by a sense amplifier activating circuit 72. The sense amplifier activating circuit 72 is formed by a buffer which receives output from a delay circuit 73 for delaying the word line driving signal WL$_i$ by a time t$_4$ to waveform-shape the same. Thus, the sense amplifier driving signal S$_N$ rises after a lapse of the time t$_4$ from rising of the word line driving signal WL$_i$.

The equlizing signal EQL is produced by a left bit line equalizing circuit 74. The left bit line equalizing circuit 74 is activated by a block selecting address (or row address) from an address buffer 54 to generate a signal which enters an inactivated state ("L" level) in response to either output from a delay circuit 75 or 76. The delay circuit 75 delays the clock signal $\overline{RAS}$ by a time t$_2$ to output the same. The delay circuit 76 delays the sense amplifier driving signal S$_N$ by a time t$_9$ to output the same. The left bit line equalizing circuit 74 generates a signal for stopping equalization (signal of "L" level) in response to the output of the delay circuit 75 when a row address designates a word line in a left memory block while otherwise generating a signal for stopping equalization in response to the output of the delay circuit 76.

The equalizing signal EQR is produced by a right bit line equalizing circuit 77. The right bit line equalizing circuit 77 is similar in structure to the left bit line equalizing circuit 74, and generates a signal which enters an inactivated state ("L" level) in response to either output from the delay circuit 75 or 76 and to a row address (block selecting address).

The transfer signal SL is generated by a left transfer signal generation circuit 78. The left transfer signal generation circuit 78 is activated on the basis of a row address signal to generate a signal which falls in response to output from a delay circuit 79 while rising in response to output from a delay circuit 80. The delay circuit 79 delays the clock signal $\overline{RAS}$ by a time t$_1$ to output the same. The delay circuit 80 delays the sense amplifier driving signal S$_N$ by a time t$_6$ to output the same. The left transfer signal generation circuit 78 is inactivated when a word line designated by the row address is included in a left memory block and is activated in other case.

The transfer signal SR is generated by a right transfer signal generation circuit 81. The right transfer signal generation circuit 81 is similar in structure to the left transfer signal generation circuit 78, and generates, in response to a row address signal (block selecting address), a signal which fa1 response to the output from the delay circuit 79 while rising in response to the output from the delay circuit 80.

The left PMOS sense amplifier driving signal S$_{PL}$ is generated by a left PMOS sense amplifier activating circuit 82. The left PMOS sense amplifier activating circuit 82 generates, in response to a row address (or block selecting address), a signal which enters an activated state ("L" level) in response to either output from a delay circuit 83 or 84. The delay circuit 83 delays the sense amplifier driving signal S$_N$ by a time t$_7$ to output the same. The delay circuit 84 delays the sense amplifier driving signal S$_N$ by a time t$_5$ to output the same. The left PMOS sense amplifier activating circuit 82 generates a signal which enters an activated state in response to the output from the delay circuit 84 when the row address designates a word line in a left block while generating a signal which enters an activated state in response to the output from the delay circuit 83 in other case.

The right PMOS sense amplifier driving signal S$_{PR}$ is generated by a right PMOS sense amplifier activating circuit 85. The right PMOS sense amplifier activating circuit 85 is similar in structure to the left PMOS sense amplifier activating circuit 85, and generates, on the basis of a row address (or block selecting address), a signal which enters an activated state ("L" level) in response to either output from the delay circuit 83 or 84.

The column selecting signal Y$_j$ is generated by a column decoder 67. The column decoder 67 decodes a column address from the address buffer 54 to select a column decoder output line connected to a pair of bit lines and make the selected output line go high in response to output from a delay circuit 86. The delay circuit 86 delays the sense amplifier driving signal S$_N$ by a time t$_8$ to output the same.

With the aforementioned structure, the control signals respectively having predetermined delay times are generated from falling of the clock signal $\overline{RAS}$ which in turn serves as a basic clock signal.

Figure 9:
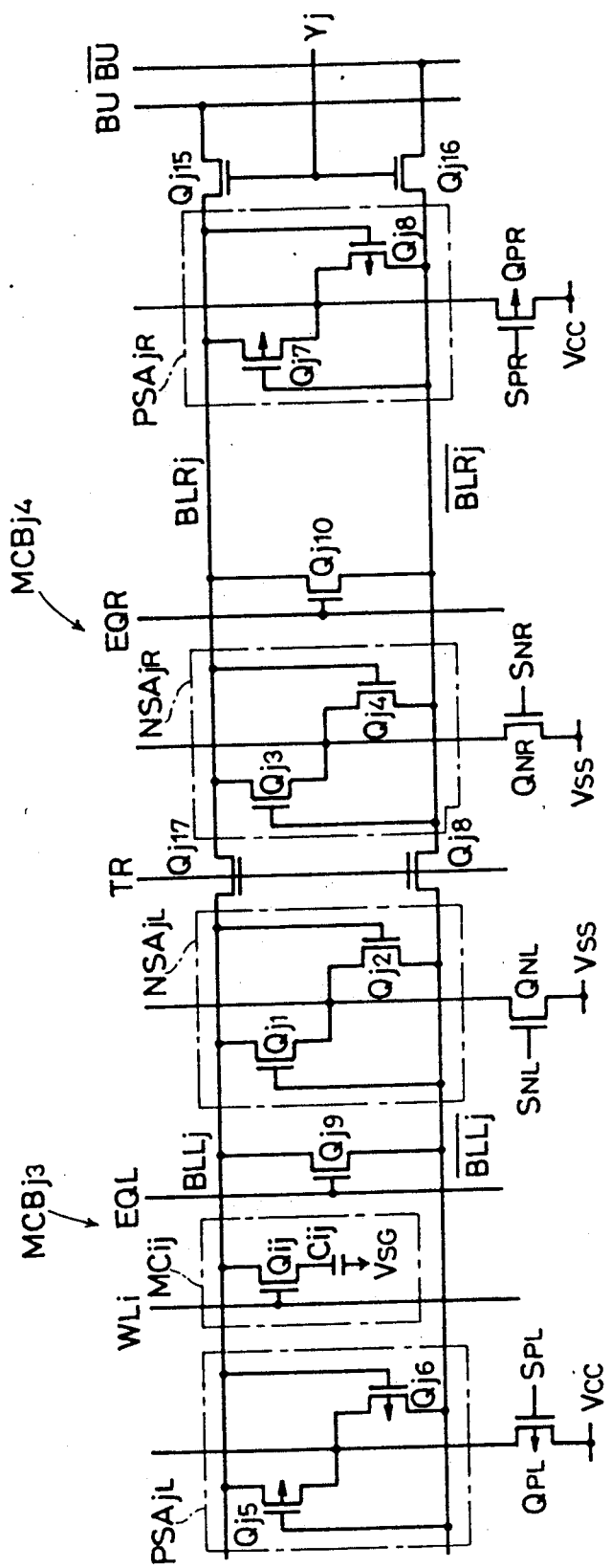
FIG. 9 illustrates the structure of a bit line part of a memory cell array of a DRAM according to another embodiment of the present invention.

Although the aforementioned embodiment is in the so-called shared sense amplifier structure of sharing an N-channel sense amplifier with left and right divided bit line pairs, N-channel sense amplifiers NSA$_{jL}$ and NSA$_{jR}$ and P-channel sense amplifiers PSA$_{jL}$ and PSA$_{jR}$ may be provided for respective memory cell array blocks MCB$_{j3}$ and MCB$_{j4}$ as shown in FIG. 9. In this case, switching means may be formed only by transfer gate FETs Q$_{j17}$ and Q$_{j18}$.

Figure 10:
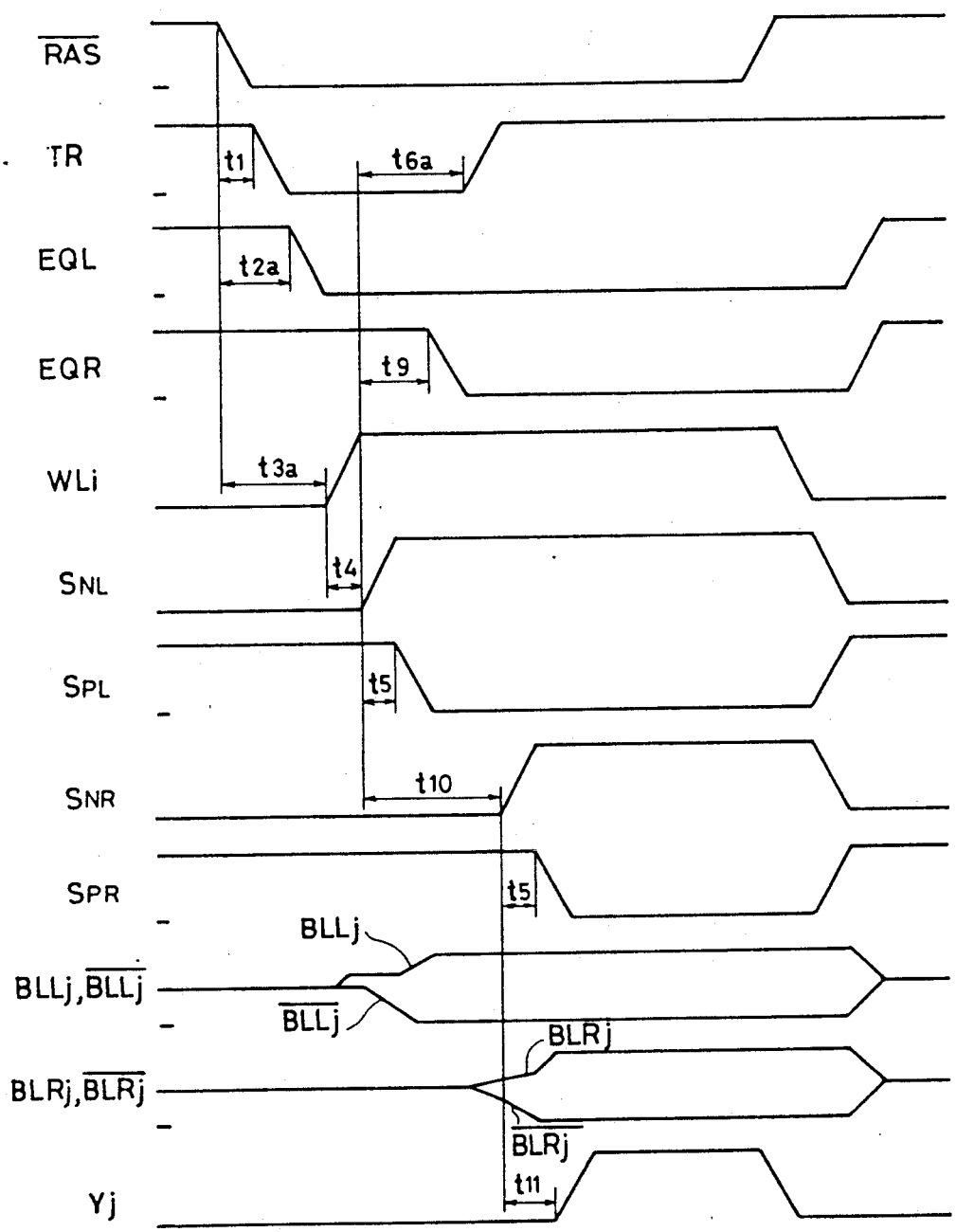
FIG. 10 is a waveform diagram showing sensing operation of the DRAM as shown in FIG. 9.

Description is briefly made of operation of the circuit as shown in FIG. 9 for reading data "1" stored in a memory cell MC$_{ij}$ with reference to FIG. 10 showing an operating waveform diagram thereof. When an Ext. $\overline{RAS}$ signal goes low, a transfer signal SR and an equalizing signal EQL for equalizing the left-side divided bit line pair are turned to low levels. Then, a word line WL$_i$ selected by a row address signal is turned to a high level. Then sense amplifier driving signals S$_{NL}$ and S$_{PL}$ sequentially go high and low, whereby the sense amplifiers NSA$_{jL}$ and PSA$_{jL}$ sequentially operate to amplify the potential difference between divided bit lines BLL$_j$ and BLL$_j$. Then an equalizing signal EQR for equalizing the right-side divided bit line pair goes low to stop equalization. Then the transfer signal SR again goes high to transfer the potentials of the divided bit lines BLL$_j$ and BLL$_j$ to the divided bit lines BLR$_j$ and BLR$_j$. Then the sense amplifier driving signals S$_{NR}$ and S$_{PR}$ sequentially go high and low, whereby the sense amplifiers NSA$_{jR}$ and PSA$_{jR}$ sequentially operate to amplify the potential difference between the divided bit lines $BLR_j$ and $\overline{BLR_j}$. Then a column selecting signal $Y_j$ goes high so that the potentials of the divided bit lines $BLR_j$ and $\overline{BLR_j}$ are transferred to bus lines BU and $\overline{BU}$, whereby the data is read out from the memory cell.

Figure 11:
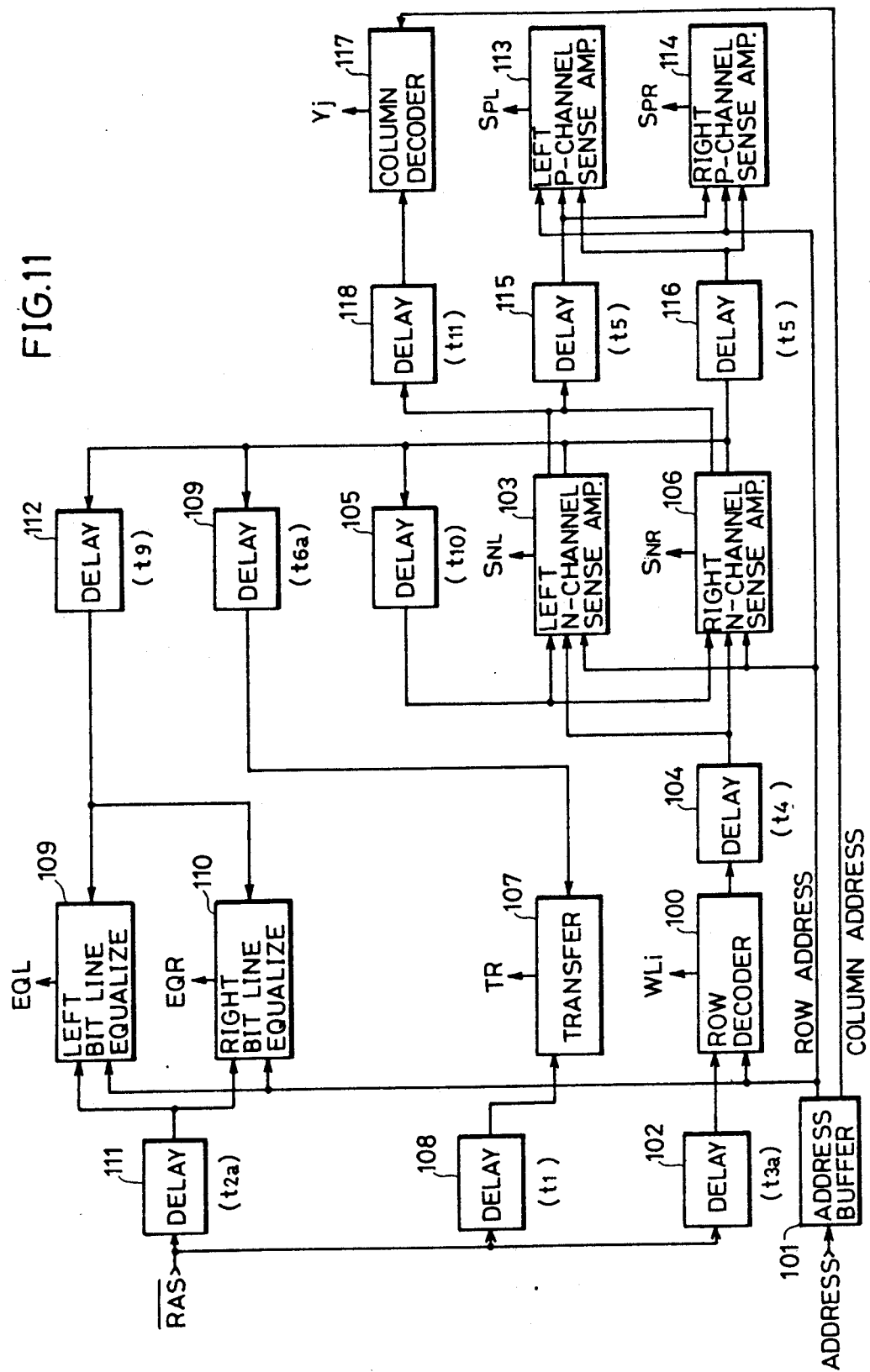
FIG. 11 is a block diagram showing circuits for producing control signals for controlling the operation of the DRAM as shown in FIG. 9.

FIG. 11 illustrates the structure of circuits for producing the control signals as shown in FIGS. 9 and 10.

A word line driving signal $WL_i$ is produced by a row decoder 100. The row decoder 100 decodes an internal row address from an address buffer 101 to select a single word line, thereby to make the potential of the selected word line rise in response to output from a delay circuit 102. The delay circuit 102 delays the clock signal $\overline{RAS}$ by a time $t_{3a}$ to output the same.

The sense amplifier driving signal $S_{NL}$ is produced by a left NMOS sense amplifier activating circuit 103. The left NMOS sense amplifier activating circuit 103 generates, on the basis of a row address (or block selecting address), a signal which rises in response to either output from a delay circuit 104 or 105. The delay circuit 104 delays the word line driving signal $WL_i$ by a time $t_4$ to output the same. The delay circuit 105 delays a previously rising one of the driving signals $S_{NL}$ and $S_{NR}$ by a time $t_{10}$ to output the same.

The sense amplifier driving signal $S_{NR}$ is produced by a right NMOS sense amplifier activating circuit 106. The right sense amplifier activating circuit 106 is similar in structure to the left sense amplifier activating circuit 103. On the basis of a row address (or block selecting address), the right sense amplifier activating circuit 106 generates a signal which rises in response to either output from the delay circuit 104 or 105.

Each of the activating circuits 103 and 106 makes its signal rise in response to the output of the delay circuit 104 when the row address (or block selecting address) designates a corresponding block, while making its signal rise in response to the output from the delay circuit 105 in other case.

The transfer signal TR is produced by a transfer circuit 107. The transfer circuit 107 generates a signal which falls in response to output from a delay circuit 108 while rising in response to output from a delay circuit 109. The delay circuit 108 delays the clock signal $\overline{RAS}$ by a time $t_1$ to output the same. The delay circuit 109 delays a previously rising one of the output signals from the activating circuits 103 and 106 by a time $t_{6a}$ to output the same.

The equalizing signals EQL and EQR are produced by left and right bit line equalizing circuits 109 and 110, respectively. Each of the bit line equalizing circuits 109 and 110 generates a signal which falls in response to either output from a delay circuit 111 or 112. Namely, each of the bit line equalizing circuits 109 and 110 makes its signal fall in response to the output from the delay circuit 111 when the row address designates a corresponding block while making its signal fall in response to the output from the delay circuit 112 in other case. The delay circuit 111 delays the clock signal $\overline{RAS}$ by a time $t_{2a}$ to output the same. The delay circuit 112 delays a previously rising one of the driving signals $S_{NL}$ and $S_{NR}$ by a time $t_9$ to output the same.

The PMOS sense amplifier driving signals $S_{PL}$ and $S_{PR}$ are produced by left and right sense amplifier activating circuits 113 and 114, respectively. Each of the sense amplifier activating circuits 113 and 114 generates, on the basis of a row address (block selecting address), a signal which falls in response to either output from a delay circuit 115 or 116. Namely, each of the sense amplifier activating circuits 113 and 114 makes its signal fall in response to the output from the delay circuit 115 when the row address designates a corresponding block, while making its signal fall in response to the output from the delay circuit 116 in other case. The delay circuit 115 delays a previously rising one of the driving signals $S_{NL}$ and $S_{NR}$ by a time $t_5$ to output the same. The delay circuit 116 delays a subsequently rising one of the driving signals $S_{NL}$ and $S_{NR}$ by a time $t_5$ to output the same.

The column selecting signal $Y_j$ is produced by a column decoder 117. The column decoder 117 decodes a column address from the address buffer 101 to make an output signal line connected to a pair of bit lines rise in response to output from a delay circuit 118 thereby to select a pair of bit lines. The delay circuit 118 delays a subsequently rising one of the sense amplifier driving signals $S_{NL}$ and $S_{NR}$ by a time $t_{11}$ to output the same.

Figure 12:
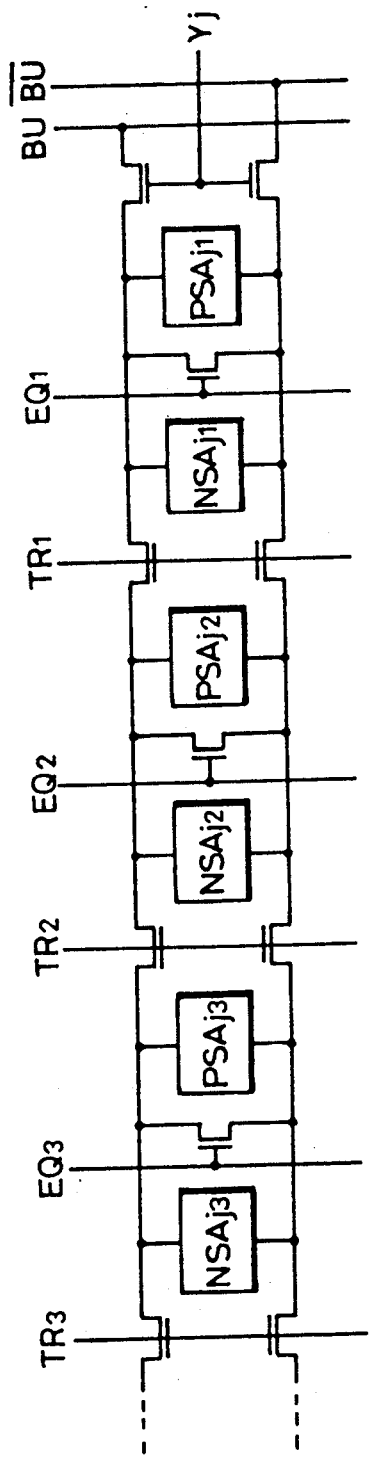
FIG. 12 illustrates the structure of a bit line part of a memory cell array of a DRAM according to still another embodiment of the present invention.

Although the bit line pair is divided into two bit line pairs in each of the aforementioned embodiments, the same may be divided into a larger number of bit line pairs while providing equalizing FETs for the respective divided bit line pairs so that timings for stopping equalization are made different for each of the divided bit line pairs, as shown in FIG. 12.

According to the present invention as hereinabove described, the timings for stopping equalization of the divided bit line pairs are made different for each of the memory cell array blocks, thereby to prevent increase in sensing time by potential difference introduced in each divided bit line pair due to noise resulting from a sensing operation in other memory cell block. Thus, a high-speed dynamic RAM having large operating margins can be obtained according to the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory comprising:
    memory cells arranged in a matrix of rows and columns, a plurality of word lines each associated with a respective row and a plurality of bit line pairs each associated with a respective column, each bit line pair comprising a plurality of divided bit line pair sections,
    sense amplifying means for amplifying a potential difference of each said divided bit line pair section so that one divided bit line of a respective section is at a first potential and the other divided bit line of said respective section is at a second potential, and
    an equalizing means in each divided bit line pair section for coupling together bit lines of each divided bit line pair section in response to an equalizing signal, said equalizing means comprising first switching means for receiving said equalizing signal;
    second switching means for coupling said divided bit line pair sections of each bit line pair, and
    timing controller means for applying activation signals to the equalizing means of each divided bit line pair section prior to a sensing operation, said timing controller means comprising means for continuing equalization of a first divided bit line pair section of a given bit line pair when a sensing operation begins in a second bit line pair section of said given bit line pair.

2. A dynamic random access memory in accordance with claim 1, wherein
said first and second sense amplifying means are sense amplifiers formed by N-channel FETs and sense amplifiers formed by P-channel FETs.

3. A dynamic random access memory in accordance with claim 1, wherein
said equalizing means are N-channel FETs.

4. A dynamic random access memory in accordance with claim 1, wherein
said switching means are N-channel FETs.

5. A dynamic random access memory as recited in claim 1, wherein said timing controller means further comprises first means for terminating an activation signal applied to said equalization means and second means for delaying termination of an activation signal applied to the equalization means of said first divided bit line pair section of said given bit line pair unitl after the sensing operation in said second bit line pair section of said given bit line pair has begun.

6. A dynamic random access memory as recited in claim 1, wherein only one of said divided bit line pairs included in one of said memory array blocks is connected to bus lines within said divided bit line pairs included in said plurality of memory cell array blocks.

7. A dynamic random access memory as recited in claim 1, wherein said equalizing means stop equalization immediately before starting of sensing operation in said memory cell array blocks including said equalizing means.

8. A dynamic random access memory as recited in claim 1, wherein said timing controller means includes means for controlling said switching means to stop connection of adjacent ones of said memory cell blocks in an interval between a predetermined time subsequent to the start of a row address select signal and a predetermined time during the period of activation of the first and second sense amplifying means subsequent to the start thereof.

9. A dynamic random access memory as recited in claim 1, wherein said memory cell block different from said memory cell array block including said equalizing means adjacent to said memory cell array block including said equalizing means.

10. A dynamic random access memory comprising:
a plurality of memory cell array blocks each including a plurality of word lines a plurality of divided bit line pairs, and memory cells each connected to one of said divided bit line pairs and to one of said word lines,
first sense amplifying means for amplifying a potential difference of each said divided bit line pair so that one divided bit line is at a first potential, and second sense amplifying means for amplifying a potential difference of each said divided bit line pair so that the other divided bit line is at a second potential, and
equalizing means for equalizing respective ones of said divided bit line pairs, said equalizing means comprising FET means for coupling bit lines of respective divided bit line pairs, each said FET means having gate electrode means for receiving equalizing signal;
switching means for coupling said divided bit line pairs of adjacent ones of said memory cell array blocks;
timing controller means coupled to said equalizing means for controlling respective timings of said equalizing signal applied to each said FET means of said equalizing means to stop said equalizing means selectively and at different times among said memory cell blocks such that each said equalizing means is stopped after sensing operation is started in a memory cell array block different from the memory cell array block including said equalizing means;
wherein only one of said divided bit line pairs included in one of said memory array blocks is connected to bus lines within said divided bit line pairs included in said plurality of memory cell array blocks.

11. A dynamic random access memory comprising:
a plurality of memory cell array blocks each including a plurality of word lines a plurality of divided bit line pairs, and memory cells each connected to one of said divided bit line pairs and to one of said word lines,
first sense amplifying means for amplifying a potential difference of each said divided bit line pair so that one divided bit line is at a first potential, and second sense amplifying means for amplifying a potential difference of each said divided bit line pair so that the other divided bit line is at a second potential, and
equalizing means for equalizing respective ones of said divided bit lines pairs, said equalizing means comprising FET means for coupling bit lines of respective divided bit line pairs, each said FET means having gate eletrode means for receiving an equalizing signal;
switching means for coupling said divided bit line pairs of adjacent ones of said memory cell array blocks;
timing controller means coupled to said equalizing means for controlling respective timings of said equalizing signal applied to each said FET means of said equalizing means to stop said equalinzing means selectively and at different times among said memory cell blocks such that each equalizing means is stopped after sensing operation is started in a memory cell array block different from the memory cell array block including said equalizing means;
wherein, said equalizing means stop equalization immediately before starting of sensing operation in said memory cell array blocks including said equalizing means.

12. A dynamic random access memory comprising:
a plurality of memory cell array blocks each including a plurality of word lines a plurality of divided bit line pairs, and memory cells each connected to one of said divided bit line pairs and to one of said word lines,
first sense amplifying means for amplifying a potential difference of each said divided bit line pair so that one divided bit line is at a first potential, and second sense amplifying means for amplifying a potential difference of each said divided bit line pair so that the other divided bit line is at a second potential, and
equalizing means for equalizing respective ones of said divided bit line pairs, said equalizing means comprising FET means for coupling bit lines of respective divided bit line pairs, each said FET means having gate electrode means for receiving an equalizing signal;

switching means for coupling said divided bit line pairs of adjacent ones of said memory cell array blocks;

timing controller means coupled to said equalizing means for controlling respective timings of said equalizing signal applied to each said FET means of said equalizing means to stop said equalizing means selectively and at different times among said memory cell blocks such that each said equalizing means is stopped after sensing operation is started in a memory cell array block different from the memory cell array block including said equalizing means;

said timing controller means includes means for controlling said switching means to stop connection of adjacent ones of said memory cell array blocks in an interval between a predetermined time subsequent to the start of a row address select signal and a predetermined time during the period of activation of the first and second sense amplifying means subsequent to the start thereof.

13. A dynamic random access memory comprising:

a plurality of memory cell array blocks each including a plurality of word lines a plurality of divided bit line pairs, and memory cells each connected to one of said divided bit line pairs and to one of said word lines, first sense amplifying means for amplifying a potential difference of each said divided bit line pair so that one divided bit line is at a first potential, and second sense amplifying means for amplifying a potential difference of each said divided bit line pair so that the other divided bit line is at a second potential, and equalizing means for equalizing respective ones of said divided bit line pairs, said equalizing means comprising FET means for coupling bit lines of respective divided bit line pairs, each said FET means having gate electrode means for receiving an equalizing signal;

switching means for coupling said divided bit line pairs of adjacent ones of said memory cell array blocks;

timing controller means coupled to said equalizing means for controlling respective timings of said equalizing signal applied to each said FET means of said equalizing means to stop said equalizing means selectively and at different times among said memory cell blocks such that each said equalizing means is stopped after sensing operation is started in a memory cell array block different from the memory cell array block including said equalizing means;

wherein, said memory cell block different from said memory cell array block including said equalizing means is adjacent to said memory cell array block including said equalizing means.

14. A method of reducing noise generation within a dynamic random access memory comprising a plurality of memory cell array blocks each including a plurality of word lines, a plurality of divided bit line pairs, and memory cells each connected to any of said divided bit line pairs and to any of said word lines, said dynamic random access memory further comprising first sense amplifier means for amplifying a potential difference of each said divided bit line pair so that one divided bit line is at a first potential, second sense amplifier means for amplifying a potential difference of each said divided bit line pair so that the other divided bit line is at a second potential and equalizing means for equalizing respective ones of said divided it line pairs, said equalizing means comprising FET means for coupling each of said divided bit line pairs, said FET means having gate electrode means for receiving an equalizing signal and switching means for coupling said divided bit line pairs between adjacent ones of said memory cell array blocks, said method comprising the steps of controlling respective timing of said equalizing signal applied to each said FET means and controlling said equalizing means to stop equalization by said equalizing means selectively and at different times among said memory cell array blocks responsive to said equalizing signal such that each said equalizing means is stopped after sensing operation is started in a memory cell array block different from the memory cell array block including said equalizing means;

wherein, said equalizing means stop equalization immediately before starting of sensing operation in said memory cell array block including said equalizing means.

15. A method of reducing noise generation within a dynamic random access memory comprising memory cells arranged in a matrix of rows and columns, a plurality of word lines each associated with a respective row and a plurality of bit line pairs each associated with a respective column, each bit line pair comprising a plurality of divided bit line pair sections, sense amplifying means for amplifying a potential difference of each said divided bit line pair section so that one divided bit line of a respective section is at a first potential and the other divided bit line of said respective section is at a second potential, an equalizing means in each divided bit line pair section for coupling together bit lines of each divided bit line pair section in response to an equalizing signal, said equalizing means comprising first switching means for receiving said equalizing signal and second switching means for coupling said divided bit line pair sections of each bit line pair, said method comprising the steps of applying activation signals to the equalizing means of each divided bit line pair section for equalization thereof prior to activation of a sense amplifier, terminating equalization of a second divided bit line pair section of a selected bit line pair, activating a respective sense amplifier to sense and amplify the potential difference of said second divided bit line pair section, and continuing equalization of a first divided bit line pair section of said selected bit line pair at the time of activation of said sense amplifier.

16. A method of reducing noise generation in a dynamic random access memory as recited in claim 15, wherein said equalizing means stop equalization immediately before starting of sensing operation in said memory cell array block including said equalizing means.

* * * * *